United States Patent [19]

Treichel et al.

[11] Patent Number: 4,990,365
[45] Date of Patent: Feb. 5, 1991

[54] METHOD FOR PRODUCING SILICON BORONITRIDE LAYERS

[75] Inventors: Helmuth Treichel, Augsburg; Oswald Spindler, Vaterstetten; Bernhard Neureither, Munich, all of Fed. Rep. of Germany

[73] Assignee: Siemens Aktiengesellschaft, Berlin and Munich, Fed. Rep. of Germany

[21] Appl. No.: 367,358

[22] Filed: Jun. 16, 1989

[30] Foreign Application Priority Data

Aug. 17, 1988 [DE] Fed. Rep. of Germany ....... 3827949

[51] Int. Cl.$^5$ ............................................. B05D 3/02
[52] U.S. Cl. ..................................... 427/45.1; 427/38; 427/47; 427/294; 427/255.2
[58] Field of Search ............... 427/45.1, 47, 38, 255.2, 427/294

[56] References Cited

PUBLICATIONS

Maeda et al., Low Dielectric Constant Amorphous SiBN Ternary Films Prepared by Plasma-Enhanced Deposition, Japanese Journal of Applied Physics, vol. 26, No. 5, May, 1987, pp. 660–665.
Mar et al., Properties of Plasma Enhanced CVD Silicon Nitride: Measurements and Interpretations, Solid State Technology, Apr. 1980, pp. 137–142.
Maeda et al., Electrical Properties and their Thermal Stability for Silicon Nitride Films Prepared by Plasma-Enhanced Deposition, J. Appl. Phys., 53(10), Oct. 1982, pp. 6852–6856.
Rand et al., Preparation and Properties of Thin Film Boron Nitride, J. Electrochem. Soc.: Solid State Science, Apr. 1968, pp. 423–429.
Hyder et al., Structure and Properties of Boron Nitride Films Grown by High Temperature Reactive Plasma Deposition, J. Electrochem. Soc.: Solid-State Science and Technology, Nov. 1976, pp. 1721–1724.

*Primary Examiner*—Bernard Pianalto
*Attorney, Agent, or Firm*—Hill, Van Santen, Steadman & Simpson

[57] ABSTRACT

To create silicon boronitride layers that are utilized as intermetallization layers and/or as final passivation layers, the present invention provides a method wherein fluid initial compounds that already molecularly contain a part of the target composition of the silicon boronitride layer to be produced are utilized, and deposited through chemical vapor deposition in an alternating electromagnetic field. The silicon boronitride layers produced in this fashion have a dielectric constant whose value is below 4 $\epsilon_o$ and are distinguished by good insulating and blocking properties and by a high break down strength.

12 Claims, 1 Drawing Sheet

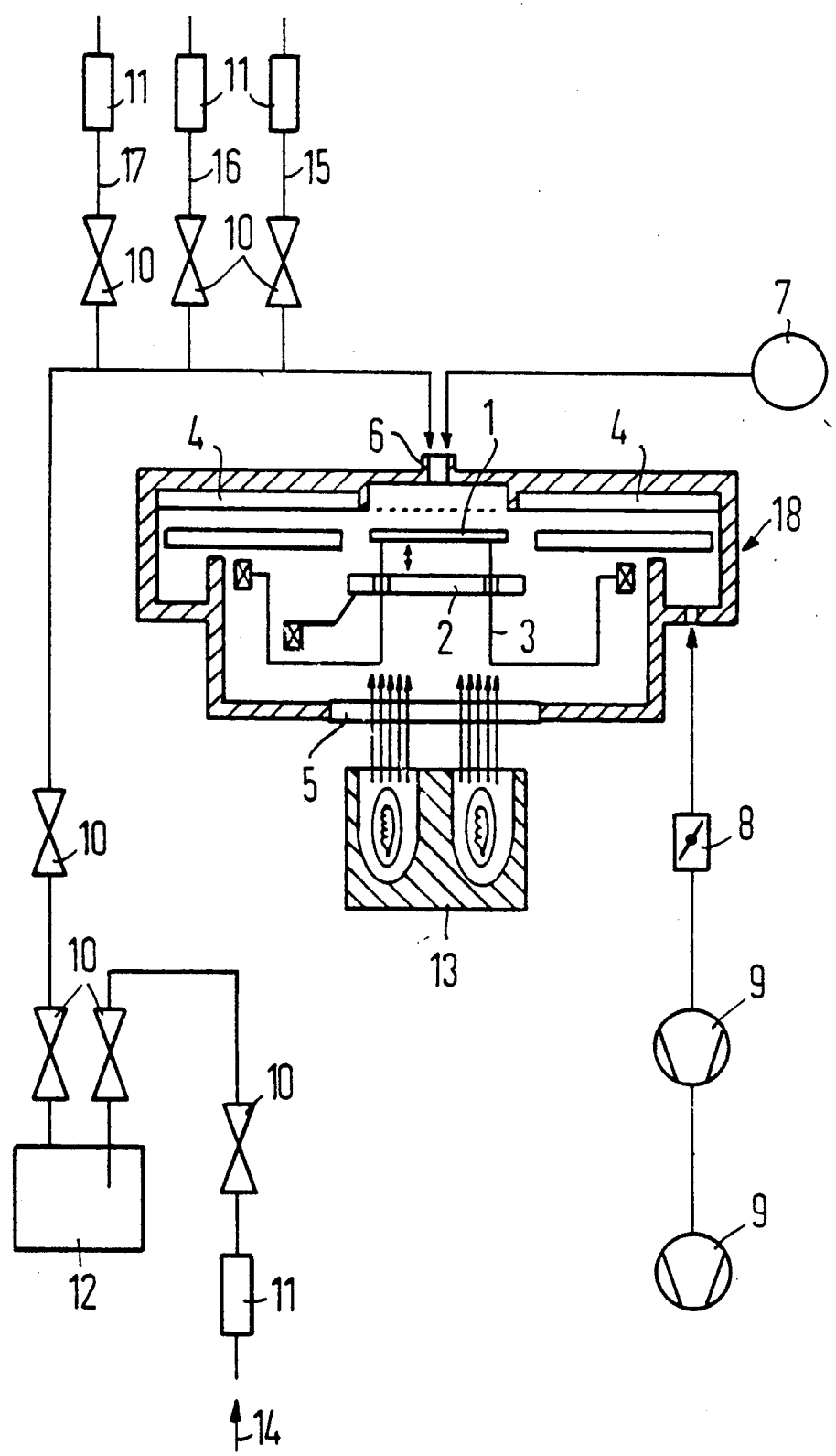

METHOD FOR PRODUCING SILICON BORONITRIDE LAYERS

BACKGROUND OF THE INVENTION

The present invention is directed to a method for producing a silicon boronitride layer having a dielectric constant $\epsilon$ of less than 4 $\epsilon_o$ by chemical vapor deposition in an alternating electromagnetic field.

Dielectric layers are required for intermetallization layers and final passivation layers in VLSI semiconductor circuits. These dielectric layers should exhibit low dielectric constants, good insulation and blocking properties, and have high break down strengths. The dielectric layers should also exhibit an optimally conformal step coverage of the layers lying therebelow and should not have a hygroscopic effect.

In recent years, silicon nitride, deposited through plasma enhanced chemical vapor deposition methods (PECVD), has been increasingly utilized as a dielectric layer. In this respect, silicon nitride has replaced phosphorosilicate glass, which exhibits the unfavorable property of hygroscopicity. The silicon nitride layers provide good insulating properties and barrier properties against humidity and alkali ions. Moreover, silicon nitride layers exhibit good step coverage and a high break down strength.

But, despite the advantages provided by the silicon nitride layers, the dielectric constant of these layers is relatively high ($\epsilon = 7$ $\epsilon_o$), compared to that of phosphorosilicate glass or other silicon oxide layers ($\epsilon = 4$ $\epsilon_o$). The relatively high dielectric constant results in parasitic leakage currents and relatively great delays in the transmission time between individual components. The articles by M. Maeda and Y. Arita, in the Journal of Applied Physics, Vol. 53, 1982, pages 6852ff and K. M. Mar and G. M. Samuelson, in Solid State Technology, Vol. 23, 9810, pages 137ff, provide a detailed discussion of this problem.

Boronitride layers are known that can be deposited by atmospheric pressure chemical vapor deposition (APCVD). The boronitride layers are chemically inert and temperature stable. Moreover, they have a low dielectric constant of $\epsilon = 2.7$ $\epsilon_o$. However, boronitride layers are not stable with respect to atmospheric humidity, specifically in high-boron films. Discussions on investigations with respect to the APCVD deposition of boronitride layers are set forth in, for example, articles by M. Rand and J. F. Roberts in the Journal of the Electrochemical Society, Vol. 115, 1968, pages 423ff and S. B. Hyder and T. O. Yep in the Journal of the Electrochemical Society, Vol. 123, 1976, pages 1721ff.

According to Patent Abstracts of Japan, Vol. 9, No. 126 E 318, 1985, a ring-shaped molecule $B_3N_3H_6$ can be used as an initial substance. In the alternative, according to W. Schmolla and H. Hartnagel in Solid State Electronics, Vol. 26, No. 10, 1983, pp. 931 ff, $B_3N_3H_3(CH_3)_3$, that is likewise a ring-shaped molecule, can be used as an initial substance.

In order to improve the moisture resistance of boronitride films, M. Maeda and T. Malino in the Japanese Journal of Applied Physics, Vol. 26, No. 5, 1987, pages 660–665 proposed a mixed nitride of silicon boronitride (SiBN). By utilizing what is referred to as a parallel plate PECVD reactor, utilizing a gas mixture composed of $SiH_4$, $B_2H_6$, $NH_3$, and Ar, this amorphous silicon boronitride is deposited. However, the method requires the installation of gas feeds and that therefore result in a complicated structure, wherein the composition of the gas mixture is difficult to control.

SUMMARY OF THE INVENTION

The present invention provides a method for producing a silicon boronitride layer that does not exhibit the disadvantage set forth above. To this end, the present invention provides a method that is simple to control and does not require a complicated structure.

To this end, the present invention provides a method for producing a silicon boronitride layer having a dielectric constant $\epsilon$ of less than 4 $\epsilon_o$ by chemical vapor deposition in an alternating electromagnetic field. Pursuant to the method, either at least one liquid, low-molecular initial compound that contains boron and nitrogen is used and is introduced into the reactor chamber with a carrier gas and at least one gaseous compound chosen from the group consisting of $SiH_4$ and $Si_2H_6$ is additionally introduced into the reactor chamber or, at least one fluid, low-molecular initial compound is used that contains boron, nitrogen, and silicon the fluid being introduced into the reactor chamber with a carrier gas.

In an embodiment, $B_3N_3H_6$ is used as the fluid initial compound and at least one compound chosen from the group consisting of $SiH_4$ and $Si_2H_6$ is additionally introduced into the reactor chamber in gaseous form.

In an embodiment, $B_3N_3H_3(SiR_3)_3$ is used as the fluid initial compound, wherein R is at least one compound chosen from the group consisting of hydrogen, $NH_2$, or alkyl.

In an embodiment, $B_3N_3(SiR_3)_6$ is used as the fluid initial compound, wherein R is hydrogen or alkyl.

In an embodiment, at least one gaseous compound chosen from the group consisting of $N_2$ and $NH_3$ is additionally introduced into the reactor chamber.

In an embodiment, $B_3N_3(SiR_3)_6$ is utilized as the fluid initial compound wherein R is $NH_2$.

In an embodiment, helium and/or nitrogen is utilized as the carrier gas.

In an embodiment of the method of the present invention, the deposition temperature is approximately 300° C. to about 450° C., the process pressure is approximately 0.1 to about 1.3 kPa, the radio frequency power is approximately 300 to about 800 W, the electrode spacing is approximately 0.3 to about 0.6 cm, the carrier gas flow is approximately 100 to about 600 sccm, the flow of $N_2$ and $NH_3$ is 0 to about 100 sccm, the flow of $SiH_4$ and $Si_2H_6$ is 0 to about 500 sccm, and the evaporator temperature is approximately 25° C. to about 80° C.

Additional features and advantages of the present invention are described in, and will be apparent from, the detailed description of the presently preferred embodiments and from the drawings.

BRIEF DESCRIPTION OF THE DRAWING

The FIGURE illustrates, schematically, an apparatus for chemical vapor deposition in an electromagnetic field.

DETAILED DESCRIPTION OF THE PRESENTLY PREFERRED EMBODIMENTS

The present invention provides a method for producing a silicon boronitride layer having a dielectric constant $\epsilon$ of less than 4 $\epsilon_o$ by chemical vapor deposition in an alternating electromagnetic field. Pursuant to the method, either at least one liquid, low-molecular initial compound that contains boron and nitrogen is used and is introduced into the reactor chamber with a carrier gas and at least one gaseous compound chosen from the group consisting of SiH$_4$ and Si$_2$H$_6$ is additionally introduced into the reactor chamber or, at least one fluid, low-molecular initial compound is utilized that contains boron, nitrogen, and silicon and that is fed into the reactor chamber with a carrier gas.

Pursuant to the method of the present invention, wherein a silicon boronitride layer is produced by chemical vapor deposition in an alternating electromagnetic field (PECVD), a deposition process is provided based on surface-controlled chemical reactions. This process is suitable for the production of silicon boronitride layers in the narrow structures of VLSI circuits.

Set forth below, by way of example, and not limitation, are three examples of the method of the present invention. In the embodiment of the method set forth in the examples, the method is utilized with a PECVD system that is schematically illustrated in the Figure. The process parameters for the system are set forth below in the following table.

| Process Parameter | Range |
| --- | --- |
| Deposition temperature | 300–450° C. |
| Process pressure | 0.1–0.3 kPa |
| RF-power | 300–800 W |
| Electrode spacing | 0.3–0.6 cm |
| Carrier gas flow | 100–600 sccm N$_2$ or He |
| N$_2$ or NH$_3$ flow | 0–100 sccm |
| SiH$_4$ or Si$_2$H$_6$ flow | 0–500 sccm |
| Evaporator temperature | 25–80° C. |

Referring now to the Figure, the Figure illustrates, schematically, an apparatus for chemical vapor deposition in an alternating electromagnetic field (PECVD). As illustrated, a semiconductor wafer 1 to be processed is positioned in a reactor chamber 18 on a semiconductor wafer lift 3, between a gas admission region 6 and a susceptor 2. The double arrow indicates the movement of the semiconductor wafer lift 3. To evacuate the reactor chamber 18, two vacuum pumps 9 are provided. The vacuum pumps 9 are connected via a butterfly valve 8. A radio frequency generator is utilized to generate an electromagnetic alternating field. In this regard, to shield individual regions of the reactor chamber 18, insulators 4 are provided.

To prepare the fluid initial compounds the system includes an evaporator vessel (bubbler) 12. Examples of fluid initial compounds useful in the method of the present invention are set forth in detail below. To provide a carrier gas, helium or nitrogen is fed into the evaporator vessel. Other gas feeds 15, 16, 17 are provided for the feed of N$_2$ (for example from hollow cathode excitation), NH$_3$ and SiH$_4$/Si$_2$H$_6$ that allow the regulation of the nitrogen and silicon constituents. All of the gas feeds include flowmeter controls 11 and pneumatic valves 10. Lamps or, respectively, a reflector module 13 that irradiates the arrangement located in the reactor chamber 18 through a crystal window 5, are provided for regulating the deposition temperature in the reactor chamber 18.

By way of example, and not limitation, examples of the method of the present invention will now be set forth.

EXAMPLE 1

In this embodiment of the method of the present invention, B$_3$N$_3$H$_6$ is used as a fluid initial compound. For example, the following compound can be used:

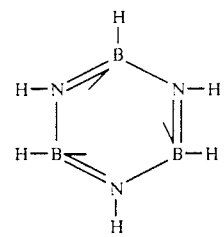

The silicon component, in this embodiment of the method of the present invention, is supplied either as gaseous Si$_2$H$_6$, with N$_2$ or NH$_3$ for setting the silicon-to-boron-to-nitrogen ratio, or as gaseous SiH$_4$. When SiH$_4$ is used the feed of gaseous nitrogen is not required.

EXAMPLE 2

In this embodiment of the method of the present invention, B$_3$N$_3$H$_3$ (SiR$_3$)$_3$ is utilized as a fluid initial compound; wherein the radical R is hydrogen, NH$_2$, or an alkyl. For example, the following compounds can be used:

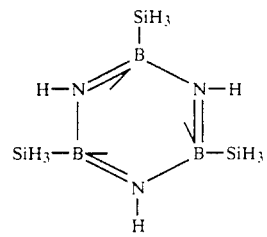

or

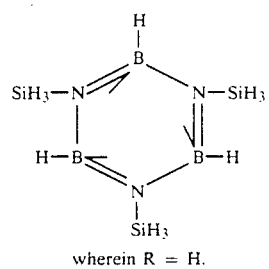

wherein R = H.

In this embodiment, the nitrogen-to-silicon ratio is set by adding N$_2$ or NH$_3$. The silicon-to-boron-to-nitrogen ratio of the layer to be produced, can be varied, particularly, on the basis of a suitable selection of the initial compound and by modifying the ratio of R.

EXAMPLE 3

In this embodiment of the method of the present invention, B$_3$N$_3$ (SIR$_3$)$_6$ is used as a fluid initial compound; wherein the radical R is hydrogen, NH$_2$ or an a ky For example, the compound can be:

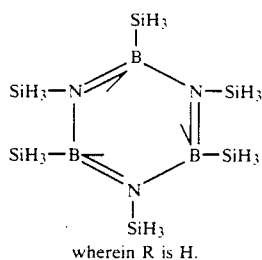

wherein R is H.

In this embodiment of the present invention, by utilizing such an initial compound that contains hydrogen or an alkyl as the radical R, the silioon-to-nitrogen is set by supplying $N_2$ or $NH_3$. Utilizing an initial compound wherein the radical R is $NH_2$, provides a compound for which a feed of gaseous nitrogen is not required In all of the above embodiments of the present invention, the value of &he dielectric constant $\epsilon$ can be varied by varying the ratio of silicon to boron and nitrogen in the silicon boronitride layer. In the various embodiments of the invention set forth, this ratio can be set by varying the initial compound, by varying the radical R at the silicon, the feed of gaseous silicon compounds ($SiH_4$, $Si_2H_6$), or the feed of gaseous nitrogen compounds ($N_2$, $NH_3$).

Pursuant to the present invention, the silicon-to-boron-to-nitrogen ratio can also be influenced through variations of the process parameters such as deposition temperature, evaporator temperature, process pressure, carrier gas quantity, and radio frequency power. By selecting the process parameters, within the range of the values recited in the table previously set forth, silicon nitride layers that exhibit dielectric constants whose value is below 4 $\epsilon_0$ are obtained pursuant to the method of present invention.

The method of the present invention utilizes fluid, low-molecular compounds that already contain both boron, as well as nitrogen (BN compounds), or respectively, boron, nitrogen, and silicon (SiBN compounds) in the compound. Accordingly, the compounds already, molecularly, contain a pair of the target composition of the silicon boronitride layer to be produced. This, in part, contributes to one of the advantages of the present invention in that the silicon boronitride layers produced exhibit a defined composition, are reproducible and are durable.

As previously stated, the decomposition of the initial compounds proceeds through a defined excitation of the molecules in an alternating electromagnetic field (PECVD). This excitation can be promoted through the use of mild thermic excitation.

The method of the present invention allows for the production of silicon boronitride layers at temperatures of from approximately 300° C. to about 450° C. These temperatures are low in comparison to other manufacturing methods, and do not adversely effect the semiconductor structures In addition to reducing the complexity of the system to a minimum and to providing a method having simple manipulability, the use of fluid initial compounds allows one to reduce the number of dangerous gases required for the process (for example, $B_2H_6$).

It should be understood that various changes and modifications to the presently preferred embodiments described herein will be apparent to those skilled in the art Such changes and modifications can be made without departing from the spirit and scope of the present invention and without diminishing its attendant advantages. It is therefore intended that such changes and modifications be covered by the appended claims.

We claim:

1. A method for producing a silicon boronitride layer having a dielectric constant $\epsilon$ of less than 4 $\epsilon_o$ by chemical vapor deposition in an alternating electromagnetic field, comprising the step of utilizing as a fluid initial compound a compound chosen from the group consisting of:

$B_3N_3H_3$ $(SiR_3)_3$ wherein R is chosen from the group consisting of hydrogen, $NH_2$, and alkyl;

$B_3N_3$ $(SiR_3)_6$ wherein R is chosen from the group consisting of hydrogen, and alkyl; and the compound is introduced into a reactor chamber with a carrier gas.

2. The method of claim 1 including the step of introducing into the reactor chamber at least one gaseous compound chosen from the group consisting of $N_2$ and $NH_3$.

3. The method of claim 1 including the step of using $B_3N_3$ $(SiR_3)_6$ as the fluid initial compound, wherein R is $NH_2$.

4. The method of claim 1 wherein the carrier gas is chosen from the group consisting of helium and nitrogen.

5. The method of claim 1 including the steps of setting a deposition temperature to approximately 300° C. to about 450° C., a process pressure to approximately 0.1 to about 1.3 kPa, a radio frequency power to approximately 300 to about 800 W, the electrode spacing to approximately 0.3 to about 0.6 cm, a flow of the carrier gas flow in the chamber is set to approximately 100 to about 600 sccm, a flow of $N_2$ and $NH_3$ is set to 0 to about 100 sccm, a flow of $SiH_4$ and $Si_2H_6$ is set to 0 to about 500 sccm, and an evaporator temperature is set to approximately 25° C. to about 80° C.

6. A method for producing a silicon boronitride layer having a dielectric constant $\epsilon$ of less than 4 $\epsilon_o$ by chemical vapor deposition in an alternating electromagnetic field, comprising the steps of:

utilizing at least one fluid, low-molecular initial compound chosen from the group consisting of: $B_3N_3H_6$; $B_3N_3H_3(SiR_3)_3$ wherein R is hydrogen, $NH_2$, or alkyl; and $B_3N_3(SiR_3)_6$, wherein R is hydrogen or an alkyl and wherein when $B_3N_3H_6$ is used additionally one compound chosen from the group consisting of $SiH_4$ and $Si_2H_6$ is additionally introduced into the reactor chamber in gaseous form; and introducing into a reactor chamber the fluid, low-molecular initial compound with a carrier gas chosen from the group consisting of helium and nitrogen.

7. The method of claim 6 including the step of introducing additionally at least one gaseous compound chosen from the group consisting of $N_2$ and $NH_3$ into the reactor chamber.

8. The method of claim 6 including the steps of setting a deposition temperature to approximately 300° C. to about 450° C., a process pressure to approximately 0.1 to about 1.3 kPa, a radio frequency power to approximately 300 to about 800 W, an electrode spacing to approximately 0.3 to about 0.6 cm, a carrier gas flow to approximately 100 to about 600 sccm, a flow of $N_2$ and $NH_3$ to 0 to about 100 sccm, a flow of $SiH_4$ and $Si_2H_6$ to 0 to about 500 sccm, and a evaporator temperature to approximately 25° C. to about 80° C.

9. The method of claim 6 wherein the fluid, low-molecular initial compound has the structure:

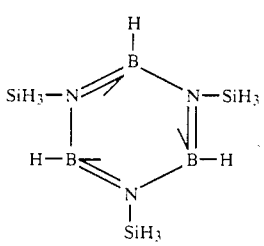

10. The method of claim 6 wherein the fluid, low-molecular initial compound has the structure:

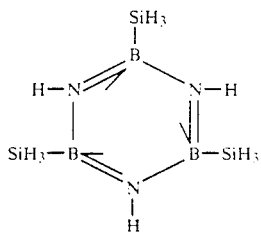

11. The method of claim 6 wherein the fluid, low-molecular initial compound has the structure:

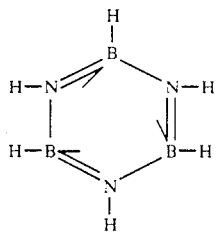

12. The method of claim 6 wherein the fluid, low-molecular initial compound has the structure:

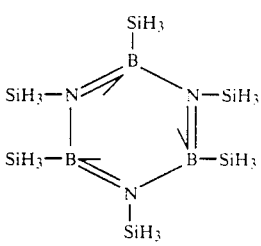

* * * * *